(12) United States Patent
Jha

(10) Patent No.: US 6,563,354 B1
(45) Date of Patent: May 13, 2003

(54) ON-CHIP CIRCUIT TO COMPENSATE OUTPUT DRIVE STRENGTH ACROSS PROCESS CORNERS

(75) Inventor: Kaushal K. Jha, Karnataka (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/533,631

(22) Filed: Mar. 22, 2000

(51) Int. Cl.[7] ................................................. H03L 7/06
(52) U.S. Cl. ........................................ 327/156; 327/163
(58) Field of Search ........................... 327/141, 156–163, 327/291, 295, 298

(56) References Cited

U.S. PATENT DOCUMENTS

| | | | | |
|---|---|---|---|---|
| 4,494,021 A | * | 1/1985 | Bell et al. ................... 327/262 |
| 5,740,152 A | * | 4/1998 | Yokogawa et al. ......... 369/275.3 |
| 5,907,255 A | | 5/1999 | Churchill ..................... 327/262 |
| 6,002,278 A | * | 12/1999 | Saito ............................ 327/115 |
| 6,034,558 A | * | 3/2000 | Vanderschoot et al. ..... 327/277 |
| 6,154,508 A | * | 11/2000 | Ott ............................... 327/141 |

\* cited by examiner

Primary Examiner—Kenneth B. Wells
(74) Attorney, Agent, or Firm—Christopher P. Maiorana, P.C.

(57) ABSTRACT

An apparatus including a first circuit, a second circuit, and a third circuit. The first circuit may be configured to generate a first signal having a first frequency. The second circuit may be configured to generate a second signal having a second frequency that is generally a function of a process variation. The third circuit may be configured to control a process variation sensitive parameter in response to the first and second signals.

21 Claims, 3 Drawing Sheets

ON-CHIP CIRCUIT TO COMPENSATE OUTPUT DRIVE STRENGTH ACROSS PROCESS CORNERS

FIELD OF THE INVENTION

The present invention relates to a method and/or architecture for control of output drive strength generally and, more particularly, to a method and/or architecture for an on-chip circuit to compensate output drive strength across process corners.

BACKGROUND OF THE INVENTION

Many applications require circuits that are insensitive or less sensitive to process variations. An example of such a application is an output buffer circuit that reduces noise across process corners.

Output drivers are generally designed to meet speed requirements at a slow process corner. An output driver designed for a slow process corner generates a lot of noise at fast corners. There is a trade off between meeting speed requirements at slow corners and keeping noise well under control at fast corners. An on-chip circuit to provide compensation for process variations would be desirable.

SUMMARY OF THE INVENTION

The present invention concerns an apparatus comprising a first circuit, a second circuit, and a third circuit. The first circuit may be configured to generate a first signal having a first frequency. The second circuit may be configured to generate a second signal having a second frequency that is generally a function of a process variation. The third circuit may be configured to control a process variation sensitive parameter in response to the first and second signals.

The objects, features and advantages of the present invention include providing an apparatus, method and/or architecture for an on-chip circuit to compensate output drive strength across process corners that may (i) make design of the output driver very simple, (ii) cut down the design cycle time drastically, (iii) improve performance of output drivers in terms of speed and noise requirements, (iv) be used to control any circuit parameter that is a function of process corners, (v) help keep more constant characteristics on output drivers, and/or (vi) provide a digital solution for compensating for process corners as opposed to an analog solution.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
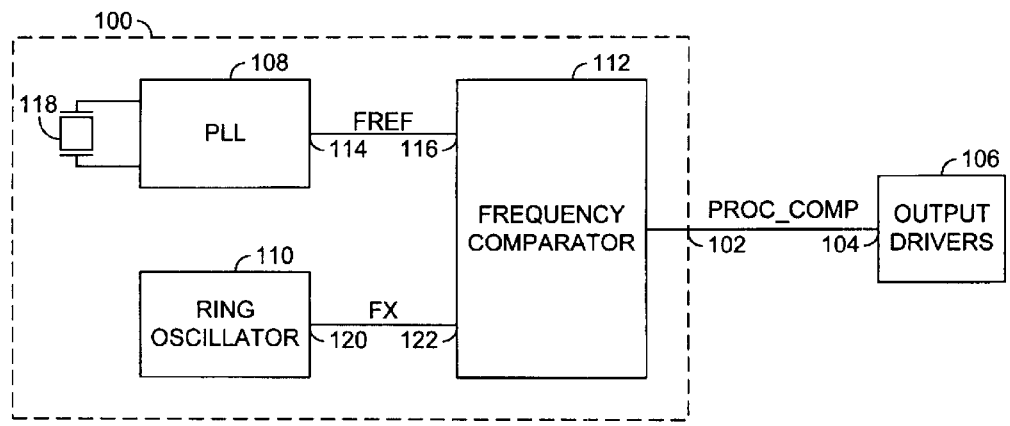
FIG. 1 is a block diagram of a preferred embodiment of the present invention.

Referring to FIG. 1, a block diagram of a circuit 100 is shown in accordance with a preferred embodiment of the present invention. The circuit 100 may be implemented, in one example, as a process variation compensation control circuit. The circuit 100 may have an output 102 that may present a compensation signal (e.g., PROC_COMP). The signal PROC_COMP may be presented to an input 104 of one or more output drivers 106. The signal PROC_COMP may be indicative of process variations. The signal PROC_COMP may be, in one example, a digital signal or a voltage level. When the signal PROC_COMP is a digital signal, the signal PROC_COMP may be N bits wide where N is an integer. The signal PROC_COMP may be used to control process variation sensitive parameters of an integrated circuit. In one example, the signal PROC_COMP may control the output drive strength of the output drivers 106.

The circuit 100 may comprise a circuit 108, a circuit 110 and a circuit 112. The circuit 108 may be implemented, in one example, as a phase lock loop (PLL). The circuit 110 may be implemented, in one example, as a ring oscillator. The circuit 112 may be implemented, in one example, as a frequency comparator circuit. The PLL 108 may have an output 114 that may present a reference signal (e.g., FREF) to an input 116 of the circuit 112. The signal FREF may have a frequency that is insensitive of process variation. The frequency of the signal FREF may be set, in one example, in response to a crystal 118. The ring oscillator 110 may have an output 120 that may present a signal (e.g., FX) to an input 122 of the circuit 112. The signal FX may have a frequency that is a function of process variation. The circuit 112 may be configured to generate the signal PROC_COMP in response to a difference between the frequency of the signal FREF and the frequency of the signal FX.

Figure 2:
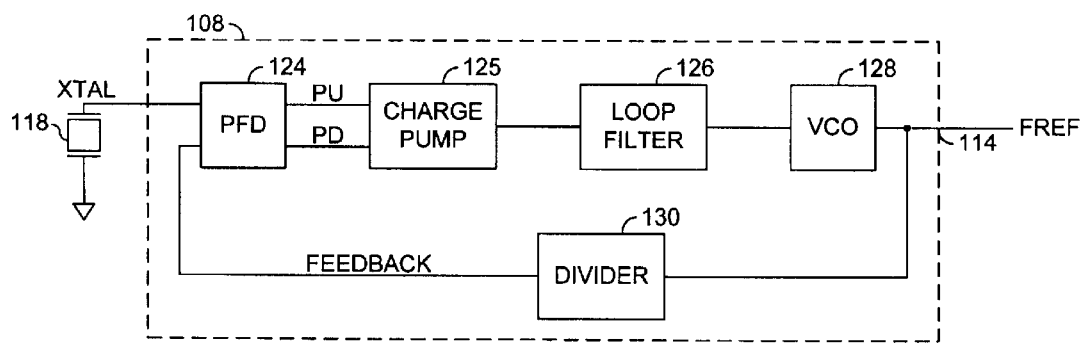
FIG. 2 is a block diagram illustrating a PLL circuit of FIG. 1.

Referring to FIG. 2, a block diagram illustrating an implementation of the phase lock loop circuit 108 is shown. The circuit 108 may comprise a phase frequency detector (PFD) 124, a charge pump 125, a loop filter 126, a voltage controlled oscillator (VCO) 128 and a divider 130. The VCO 128 generally presents the signal FREF to the divider 130. The divider 130 generally presents a signal (e.g., FEEDBACK) to the PFD 124. The PFD 124 may also receive a reference clock signal (e.g., XTAL) from the crystal 118. The PFD 124 may be configured to generate pump signals (e.g., PU and PD) in response to a difference in frequency between the signal XTAL and the signal FEEDBACK. The pump signals PU and PD may be presented to the charge pump 125. The charge pump 125 may be configured to generate a voltage signal in response to the pump signals PU and PD. The voltage signal is generally presented via the loop filter 126 to the VCO 128. The VCO 128 may be configured to generate the signal FREF in response to the voltage signal from the charge pump 125.

Since the signal XTAL is generated by the crystal 118, the signal XTAL is generally independent of process corners. The PLL 108 may be configured to generate the signal FREF with a frequency that is generally higher than the frequency of the signal XTAL. The frequency of the signal FREF may be determined, in one example, by multiplying the frequency of the signal XTAL by a divider factor of the divider 130. The PLL 108 generally synchronizes the signal FEEDBACK with the signal XTAL. The synchronization of the signal FEEDBACK to the signal XTAL may transfer the independence of the signal XTAL from the effects of process variations to the frequency of the signal FREF.

In an alternative embodiment, the circuit 100 may have an input that may receive a fixed high frequency clock signal in place of the PLL 108. In such an alternative embodiment, the fixed high frequency clock signal may be used in place of the signal FREF. For example, the signal XTAL may be used, in one example, in place of the signal FREF.

Figure 3:
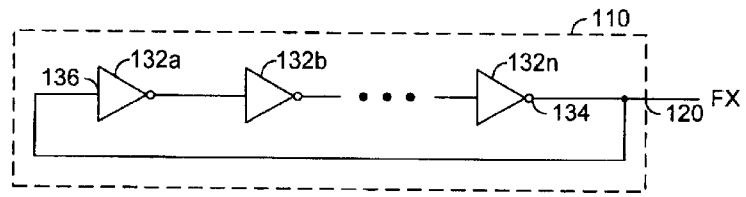
FIG. 3 is a block diagram illustrating a ring oscillator circuit of FIG. 1.

Referring to FIG. 3, a block diagram illustrating an implementation of the ring oscillator 110 is shown. The ring oscillator 110 may comprise several inverting stages 132a–132n. The inverting stages 132a–132n are generally connected in series. An output 134 of the last stage 132n is generally looped back to an input 136 of the first stage 132a with enough propagation delay to allow sufficient phase margin for an inversion. The output of each stage is shifted in phase from the previous stage. The magnitude of the shift may be determined by the stage delay and may be a function of process variation. The signal FX may be presented at the output 134.

Figure 4:
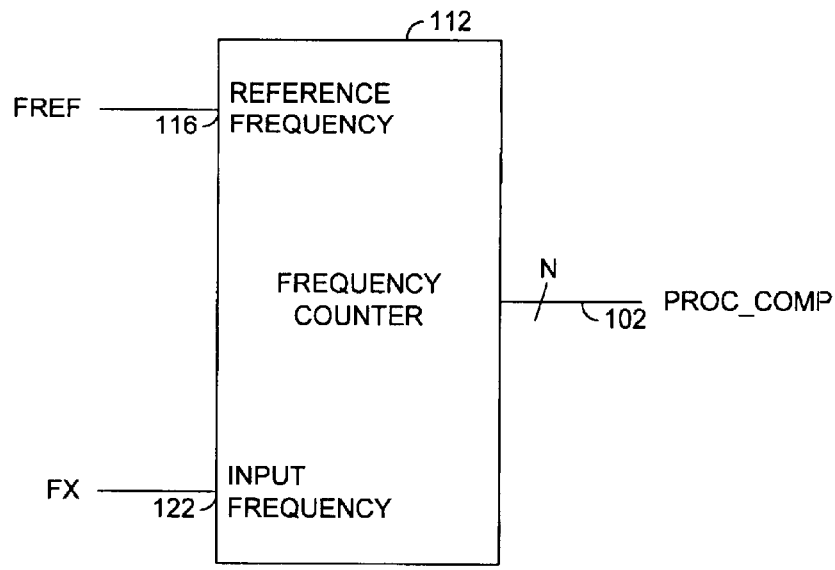
FIG. 4 is a block diagram illustrating a frequency comparator circuit of FIG. 1.

Referring to FIG. 4, a block diagram illustrating an implementation of the circuit 112 of FIG. 1 is shown. The circuit 112 may be implemented, in one example, as a frequency counter. The frequency counter 112 may have a reference frequency input 116 that may receive the signal FREF, an input frequency input 122 that may receive the signal FX, and an output that may present the signal PROC_COMP. The frequency counter 112 may be configured to generate the signal PROC_COMP as an N-bit wide digital signal indicative of the frequency difference between the signals FREF and FX.

Figure 5:
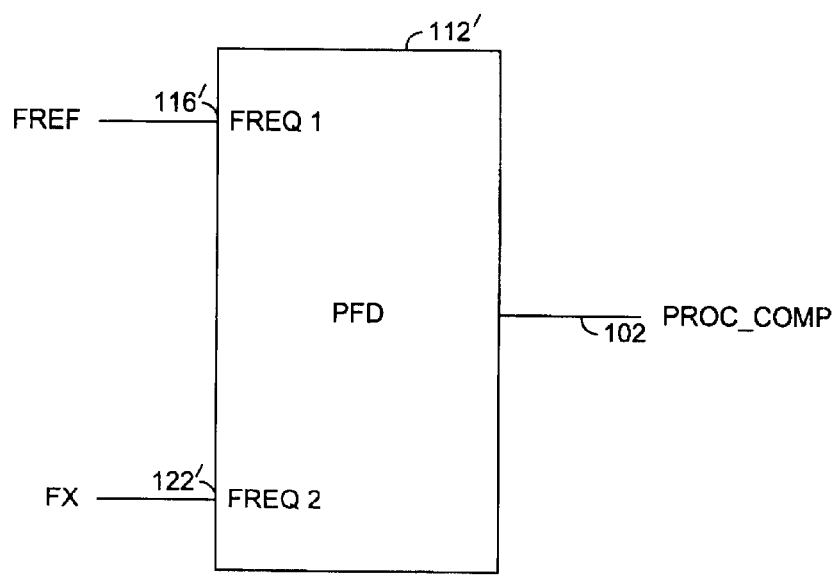
FIG. 5 is a block diagram illustrating an alternative embodiment of the frequency comparator circuit of FIG. 4.

Referring to FIG. 5, a block diagram of a circuit 112' illustrating an alternative embodiment of the circuit 112 of FIG. 4 is shown. The circuit 112' may be implemented, in one example, as a phase frequency detector. The signal FREF may be presented to an input 116' of the phase frequency detector 112' and the signal FX may be presented to an input 122' of the phase frequency detector 112'. The phase frequency detector 112' may be configured to generate the signal PROC_COMP as a voltage signal indicative of the frequency difference between the signals FREF and FX.

Figure 6:
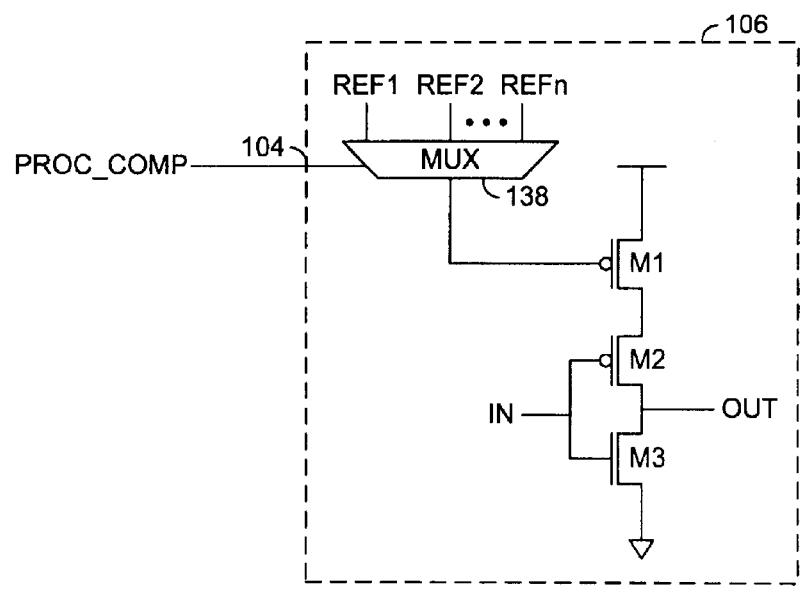
FIG. 6 is a schematic diagram illustrating an output driver circuit of FIG. 1.

Referring to FIG.6, a schematic diagram illustrating an implementation of the circuit 106 of FIG. 1 is shown. The circuit 106 may comprise a transistor M1, a transistor M2, a transistor M3, and a multiplexer 138. When the signal PROC_COMP comprises a digital signal indicative of the process variation, the signal PROC_COMP may be presented to a control input of the multiplexer 138. The multiplexer 138 may select one of a number of bias voltages as an output signal in response to the signal PROC_COMP. An output of the multiplexer may be connected to a gate of the transistor M1. The transistor M1 may control the output drive strength of the transistors M2 and M3.

Figure 7:
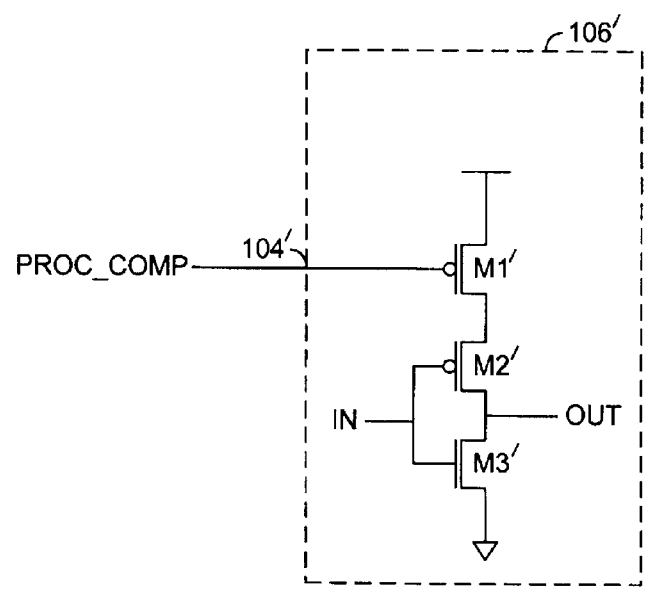
FIG. 7 is a schematic diagram of an alternative embodiment of the output driver circuit of FIG. 6.

Referring to FIG. 7, a schematic diagram of a circuit 106' illustrating an alternative embodiment of the circuit 106 is shown. The circuit 106' may comprise a transistor M1', M2' and M3'. When the signal PROC_COMP comprises a voltage level indicative of the process variation, the signal PROC_COMP may be presented to a gate of the transistor M1'. The transistors M1', M2' and M3' may operate similarly to the transistors M1, M2 and M3 described in connection with FIG. 6.

The present invention may provide an on-chip circuit, that may detect a process corner and change a drive strength of one or more output drivers accordingly to meet both speed and noise requirements across process corners. The present invention may be used to control other process sensitive parameters (e.g., delay of a delay chain, trip point of a TTL, etc.) across process corners. This circuit may be used cost-effectively in integrated circuits that already contain a phase lock loop (e.g., clock chips).

The present invention generally compares frequency as opposed to voltages. The frequency of the signal FREF will generally be insensitive of process corners. In contrast, the frequency of the signal FX will generally be a function of the process corners. The frequency of the signal FX will generally be high at fast process corners and low at slow process corners. Comparing the signals FREF and FX will generally provide an indication of the process corners of a particular chip. The signal FREF may be used to measure the signal FX using, in one example, a frequency counter. An output of the frequency counter may denote the process corners. The output of the frequency counter may be used, in one example, to control the drive strength of an output driver.

An alternative embodiment of the circuit 100 may provide the capability of turning off the ring oscillator 110. In another alternative embodiment, the circuit 100 may be switched on initially to set a compensation value and then switched off.

While the invention has been particularly shown and described with reference to the preferred embodiments thereof, it will be understood by those skilled in the art that various changes in form and details may be made without departing from the spirit and scope of the invention.

What is claimed is:
1. An integrated circuit comprising:
   a first circuit configured to generate a first signal having a first frequency;
   a second circuit configured to generate a second signal having a second frequency that is (i) independent of said first signal and (ii) a function of a process variation; and
   a third circuit configured to control a process variation sensitive parameter in response to said first and second signals, wherein said integrated circuit is configured to (i) be set to a compensation level when switched on and (ii) then switched off.
2. The integrated circuit according to claim 1, wherein said first frequency is insensitive to said process variation.
3. The integrated circuit according to claim 1, wherein said third circuit is configured to generate a third signal in response to said first and second signals, said third signal controlling said process variation sensitive parameter.
4. The integrated circuit according to claim 1, wherein said first circuit comprises a phase lock loop.
5. The integrated circuit according to claim 1, wherein said frequency of said first signal is determined by a crystal.
6. The integrated circuit according to claim 1, wherein said second circuit comprises a ring oscillator.
7. The integrated circuit according to claim 1, wherein said third circuit comprises a phase frequency detector circuit.
8. The integrated circuit according to claim 1, wherein said third circuit comprises a frequency counter.
9. The integrated circuit according to claim 1, further comprising one or tore output drivers coupled to said third circuit.
10. The integrated circuit according to claim 9, wherein said third signal controls an output drive strength of said one or more output drivers.
11. The integrated circuit according to claim 1, wherein said first circuit is external to said integrated circuit.

12. An integrated circuit comprising:
   means for generating a first signal having a first frequency;
   means for generating a second signal having a second frequency that is (i) a function of a process variation and (ii) independent of said first signal; and
   means for controlling a process variation sensitive parameter in response to said first and second signals, wherein said integrated circuit is configured to (i) be set to a compensation level when switched on and (ii) the switched off.

13. A method for controlling process variation compensation in an integrated circuit comprising the steps of:
   (A) generating a first signal having a first frequency;
   (B) generating a second signal having a second frequency that is (i) a function of a process variation and (ii) independent of said first signal;
   (C) controlling a process variation sensitive parameter in response to said first and second signals;
   (D) switching said first and/or second signals on to set a compensation level; and
   (E) switching first and/or second signals off after a predetermined time.

14. The method according to claim 13, wherein said first frequency is insensitive to said process variation.

15. The method according to claim 13, wherein step (C) comprises the sub-steps of:
   (C-1) generating a third signal in response to said first and said second signals; and
   (C-2) controlling said process variation sensitive parameter in response to said third signal.

16. The method according to claim 13, wherein said process variation sensitive parameter comprises an output drive strength of one or more output drivers.

17. An apparatus comprising:
   a first circuit comprising a voltage controlled oscillator and a phase frequency detector, said first circuit configured to generate a first signal having a first frequency, wherein said first circuit further comprises a phase locked loop circuit configured to control said voltage controlled oscillator in response to said first signal and a reference clock signal;
   a second circuit comprising a ring oscillator configured to generate a second signal having a second frequency that is a function of a process variation; and
   a third circuit configured to control a process variation sensitive parameter in response to a comparison of said first and second frequencies.

18. The apparatus according to claim 17, wherein said reference clock signal is generated in response to a crystal signal.

19. The apparatus according to claim 17, wherein said process variation sensitive parameter comprises one or more parameters of the group consisting of an output drive strength, a trip point of a logic gate, and a delay chain.

20. The apparatus according to claim 17, wherein said third circuit comprises a frequency counter.

21. The apparatus according to claim 17, wherein said third circuit comprises a phase frequency detector.

* * * * *